(12) United States Patent
Robb et al.

(10) Patent No.: US 11,997,430 B2
(45) Date of Patent: May 28, 2024

(54) SPATIAL LIGHT MODULATORS

(71) Applicant: Texas Instruments Incorporated, Dallas, TX (US)

(72) Inventors: Noah Alan Robb, Plano, TX (US); Harsh Dinesh Jhaveri, Wylie, TX (US); Priyankar Mathuria, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 704 days.

(21) Appl. No.: 17/146,363

(22) Filed: Jan. 11, 2021

(65) Prior Publication Data
US 2022/0224868 A1 Jul. 14, 2022

(51) Int. Cl.
| | |
|---|---|
| *G02B 26/08* | (2006.01) |
| *B81B 7/02* | (2006.01) |
| *G02B 26/10* | (2006.01) |
| *G11C 5/06* | (2006.01) |
| *G11C 11/413* | (2006.01) |
| *H04N 9/31* | (2006.01) |

(52) U.S. Cl.
CPC ............. *H04N 9/312* (2013.01); *B81B 7/02* (2013.01); *G02B 26/0816* (2013.01); *G02B 26/0833* (2013.01); *G02B 26/105* (2013.01); *G11C 5/063* (2013.01); *G11C 11/413* (2013.01); *H04N 9/3152* (2013.01); *B81B 2201/042* (2013.01); *B81B 2201/07* (2013.01)

(58) Field of Classification Search
CPC .... H04N 9/312; H04N 9/3152; H04N 9/3111; B81B 7/02; B81B 2201/042; B81B 2201/07; G02B 26/0816; G02B 26/0833; G02B 26/105; G11C 5/063; G11C 11/413; G11C 8/08; G11C 11/412; G11C 11/418; G11C 5/025
See application file for complete search history.

(56) References Cited

U.S. PATENT DOCUMENTS

| | | | | |
|---|---|---|---|---|
| 7,394,140 | B2* | 7/2008 | Patel ...................... | G09G 3/346 257/443 |
| 7,982,690 | B2* | 7/2011 | Arai ....................... | G09G 3/346 345/32 |

* cited by examiner

*Primary Examiner* — Euncha P Cherry
(74) *Attorney, Agent, or Firm* — Michelle F. Murray; Frank D. Cimino

(57) ABSTRACT

In a described example, a device includes: a semiconductor substrate; a memory array on the semiconductor substrate, the memory array comprising rows and columns of memory cells in a Manhattan pattern, the memory cells having a pitch in a direction along the columns; and an array of micromirrors in a diamond pattern over the memory cells, the micromirrors coupled to corresponding memory cells, the micromirrors having a diagonal pitch length in the direction along the columns that is between 1.8 times the pitch and 2.2 times the pitch.

20 Claims, 15 Drawing Sheets

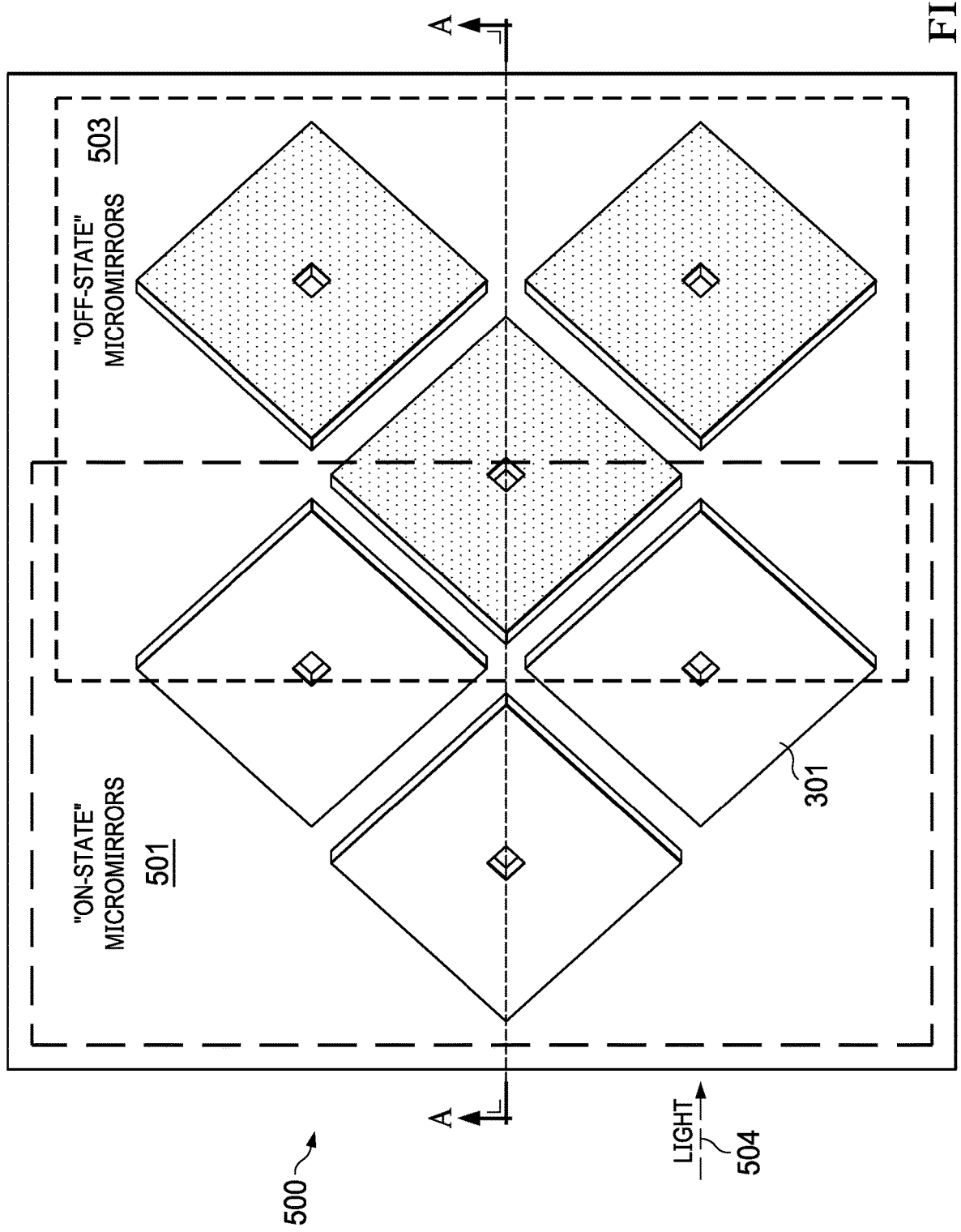

SPATIAL LIGHT MODULATORS

SUMMARY

In a described example, a device includes: a semiconductor substrate; a memory array on the semiconductor substrate, the memory array comprising rows and columns of memory cells in a Manhattan pattern, the memory cells having a pitch in a direction along the columns; and an array of micromirrors in a diamond pattern over the memory cells, the micromirrors coupled to corresponding memory cells, the micromirrors having a diagonal pitch length in the direction along the columns that is between 1.8 times the pitch and 2.2 times the pitch.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIGS. 5A-5B illustrate in a plan view a portion of a micromirror array with micromirrors in ON and OFF state positions, and the operations of the micromirrors.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Figure 1:
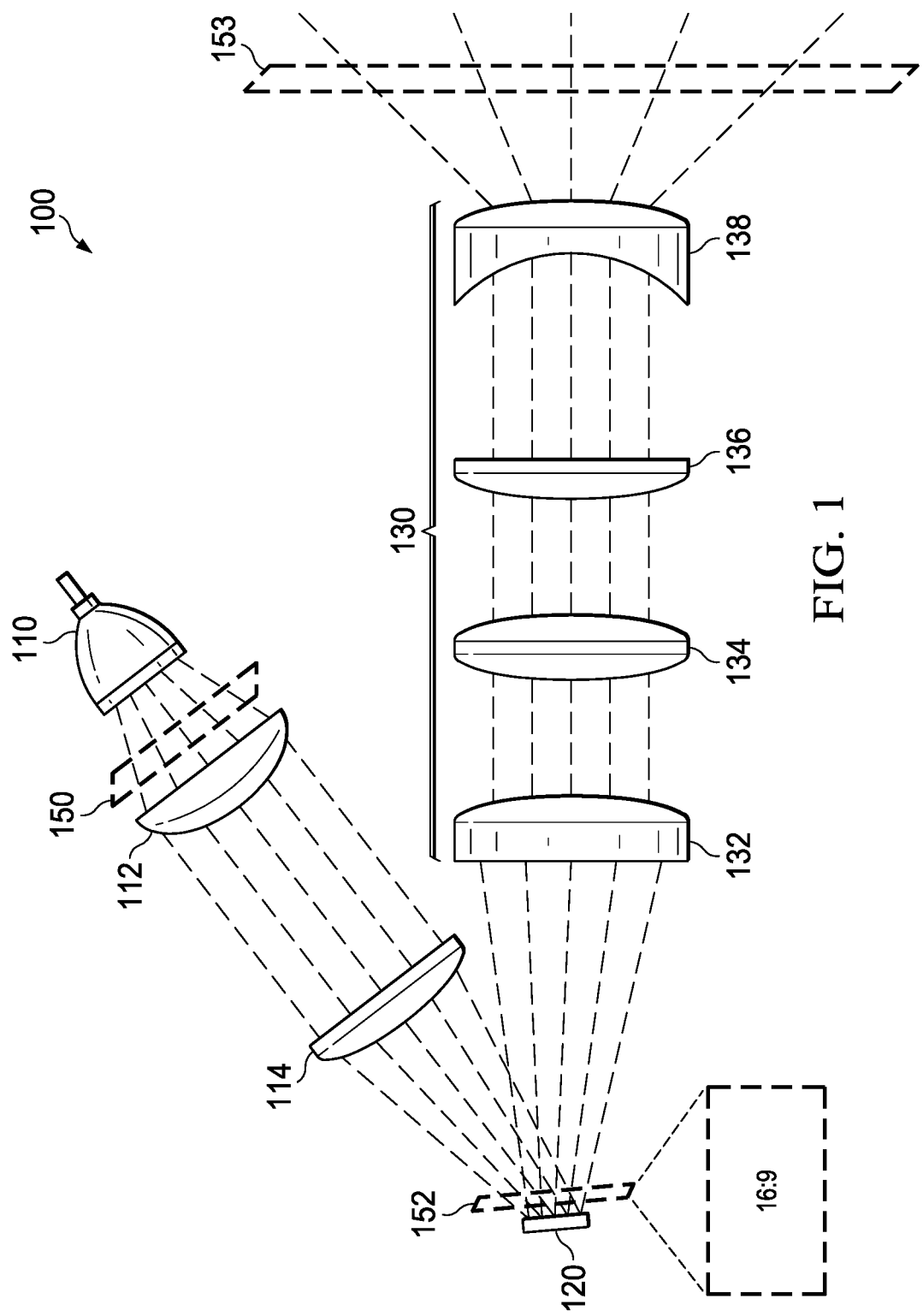
FIG. 1 is a block diagram for an example optical projection system with a spatial light modulator.

The making and using of example arrangements that incorporate aspects of the present application are discussed in detail below. It should be appreciated, however, that the examples disclosed provide many applicable inventive concepts that can be embodied in a wide variety of specific contexts. The specific examples and arrangements discussed are illustrative of specific ways to make and use the various arrangements, and the examples described do not limit either the scope of the specification, or the scope of the appended claims.

For example, when the term "coupled" is used herein to describe the relationships between elements, the term as used in the specification and the appended claims is to be interpreted broadly, and is not to be limited to "connected" or "directly connected" but instead the term "coupled" may include connections made with intervening elements, and additional elements and various connections may be used between any elements that are "coupled." The term "optically coupled" is used herein. Elements that are "optically coupled" have an optical connection between the elements but various intervening elements can be between elements that are "optically coupled."

The term "pitch" means a distance between repeated elements including spacing between the elements. When elements have a uniform pitch, the elements are repeated along a row or column, and the pitch for the elements is uniform between the elements. Pitch is a distance, and depending on the direction, can be described as a length, diagonal, or width of an element. By using a smaller pitch for repeated elements in an array, the packing density is improved, and the overall area of a semiconductor device can be reduced. By using similar pitch distances for any peripheral circuitry placed around the array, the packing density can also be improved.

The term "Manhattan pattern" refers to a pattern for laying out two dimensional elements in an array. When elements are arranged in a Manhattan pattern, it means the elements are arranged in rows and columns where along the rows, the elements are aligned to the adjacent elements, and along the columns, the elements are aligned to the adjacent elements, and the rows and columns intersect at a normal angle, to form a grid with elements at the intersections of rows and columns. In the memory arrays of the arrangements, the elements are memory cells in a Manhattan pattern having uniform pitch in width along the rows. In the illustrated examples, the memory cells are square and have the same uniform pitch in length along the columns.

The term "diamond pattern" means that square elements are arranged with diagonals along row and column directions so that in a plan view, the elements appear diamond shaped. In the arrangements, micromirrors are arranged in a diamond pattern. With respect to adjacent rows of micromirrors, the micromirrors are staggered.

In the arrangements, a memory cell array is placed in a Manhattan pattern with N rows and M columns, where M and N are positive integers. An array of micromirrors overlays the memory array. The micromirrors are arranged in a diamond pattern with staggered rows of K micromirrors in each row, where K is a positive integer that is equal to or less than M/2, so that there are half as many micromirrors as there are memory cells. The micromirrors have an area greater than the area of the memory cells. The array of memory cells has redundant columns, so that for a row of memory cells in the array, every other memory cell is coupled to a micromirror, and every other memory cell is not coupled to a micromirror. In an example arrangement a spatial light modulator is a digital micromirror device (DMD) having micromirrors that tilt to "ON" and "OFF" states based on data stored in a corresponding memory cell. In alternative arrangements, the micromirrors may have a diagonal pitch that is a greater multiple of the memory cell pitch, so that the micromirrors may cover the area of 4, 8 or 16 memory cells, in addition to the 2× arrangements used in the examples.

The spatial light modulator includes an array of picture elements ("pixels") that are micromirrors. The micromirrors move to change a pattern on the spatial light modulator. An array of individually accessible memory cells store bits of information, these bits produce voltages that drive the micromirrors. The spatial light modulators in the arrangements are digital micromirror device ("DMD") spatial light modulators ("SLM"). The micromirrors in the DMD tilt in response to the stored voltages in the memory cells to direct illumination light either to projection optics, or away from the projection optics, to modulate the illumination light and vary intensity in a displayed image. A DMD may have thousands, hundreds of thousands, or millions of micromirrors arrayed in rows and columns.

DMDs are micro-electrical-mechanical systems (MEMS) devices produced in a semiconductor manufacturing processes. A semiconductor wafer is processed to have many DMD devices manufactured on it. The cost of the DMDs falls when more devices are made on a single wafer. The size of the DMD devices is therefore important because as the devices get smaller, the number of devices per wafer processed increases, while the cost decreases. Smaller and lower cost DMDs are desirable.

FIG. 1 is a block diagram illustrating an example arrangement for a headlamp 100. In FIG. 1, a light source 110 produces light, which is transmitted through collection and collimating lens 112. The aspect ratio 150 of the light beam from the light source 110 is equal to or greater than an aspect ratio of a spatial light modulator (SLM) which is DMD 120. The light beam from the collimating lens 112 travels to the beam shaping lens 114, where the light is focused on the surface of the DMD 120. The light beam is then reflected from micromirrors on the DMD 120 to the projection lens set 130, which in this example includes a doublet lens 132, a focusing lens 134, a cylindrical lens 136 and an anamorphic lens 138. The light beam exits the projection lens set 130 with a final aspect ratio of about 3.3:1 (reference label 153). In other examples, the final aspect ratio can be greater than about 2. While a headlamp 100 is shown as an example application in FIG. 1, the arrangements are useful with other applications where SLMs are used, for example digital image projectors, video displays, heads up displays, cinema and presentation projectors, video games, LIDAR, window displays, and near eye displays, such as virtual reality or augmented reality headsets and displays. When color projectors are used, the number of light sources may be increased, for example red, green and blue light emitting diodes (LEDs) can be used to illuminate the SLM in sequential red green blue operations to project color images. Alternative arrangements include using phosphor wheels, color filters, laser diodes, and/or static phosphors to produce multiple colors.

The light source 110 can produce white light using LEDs, other white light sources are also useful. Alternatives include using a blue laser to excite a yellow phosphor, a halogen light, or an incandescent light.

After the illuminating light beam is received and reflected by the DMD 120, according to image information supplied electronically to the SLM from an image projection circuit or system, a pattern of the DMD 120 modulates the light. The modulated light is reflected from the DMD 120 and enters the projection lens set 130 with the same or a similar aspect ratio 152 as the aspect ratio of the DMD 120. Anamorphic lens 138 may also reshape the light beam to meet the aspect ratio 153. The aspect ratio 153 in this example is designed for a headlamp application, preserving a center peaked light distribution. In other applications, the anamorphic lens elements may be omitted, and uniform illumination of the DMD 120 and a uniform light distribution in the projected image may be used.

Figure 2:
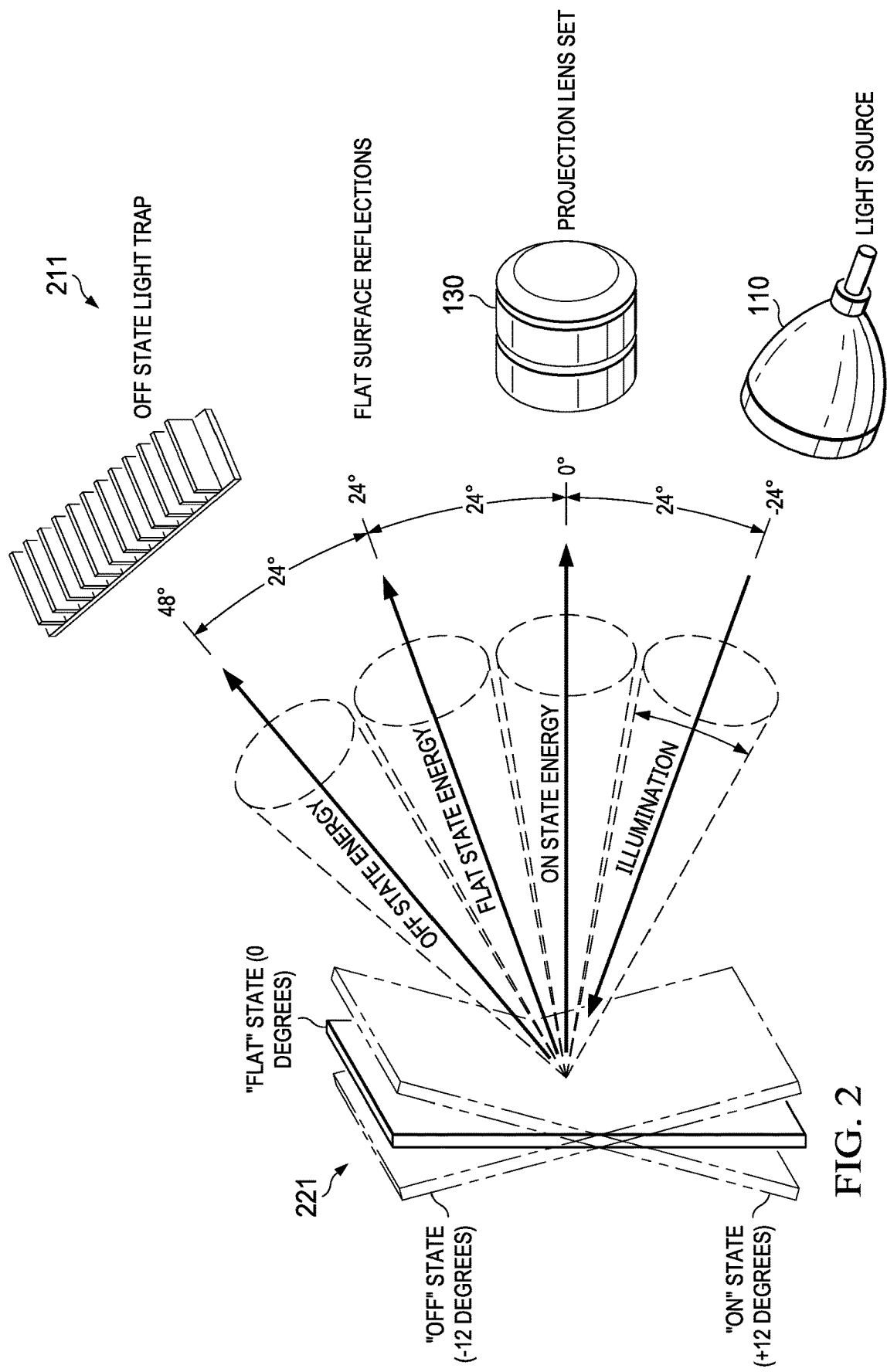
FIG. 2 illustrates the operations of a micromirror of a digital micromirror device (DMD).

FIG. 2 illustrates the operation of a micromirror 221 of an example DMD. A DMD used in the arrangements will have thousands, hundreds of thousands, or even millions of micromirrors in a two dimensional array. The example micromirror 221 tilts at +/−12 degrees. In DMD devices, varying tilt angles are used. When the micromirror 221 is not powered, the micromirror has a flat state position, which is designated " " FLAT STATE" (0 degrees) in FIG. 2. When the micromirror 221 is in an "OFF" state, it tilts away from the flat positon to a −12 degree position, and the light reflected is directed away from the projection lens set 130 and to a light trap 211. When the micromirror is in an "ON" state, the micromirror 221 tilts to a +12 degree position and the illumination light from light source 110 is reflected from the micromirror to the projection lens set 130. The tilt angle for the micromirror is determined by data stored in a memory element (not shown in FIG. 2) that is coupled to the micromirror. As is further described below, in a DMD of the arrangements, an array of memory cells in rows and columns is coupled to the array of micromirrors, and the memory cells are written with data in a bitmap pattern. When the micromirrors are updated, the entire array of micromirrors changes position in correspondence with the pattern stored in the memory array, each micromirror taking a position determined by the data stored in the associated memory cell. In an arrangement for a device, the memory array cells are formed in a silicon substrate in rows and columns, and the micromirrors form a micromirror array, having rows and columns, over the array of memory cells. The micromirrors lie over memory cells that control the motion of the individual micromirrors. The overall size of the DMD device is therefore determined, in part, by the size of the memory cells and the associated circuitry. The smaller area that the devices use on the semiconductor wafer used to fabricate the devices, the more devices that can be produced per wafer. Because the cost for the devices falls with an increased number of devices per wafer, reduced device area is desirable.

Figure 3:
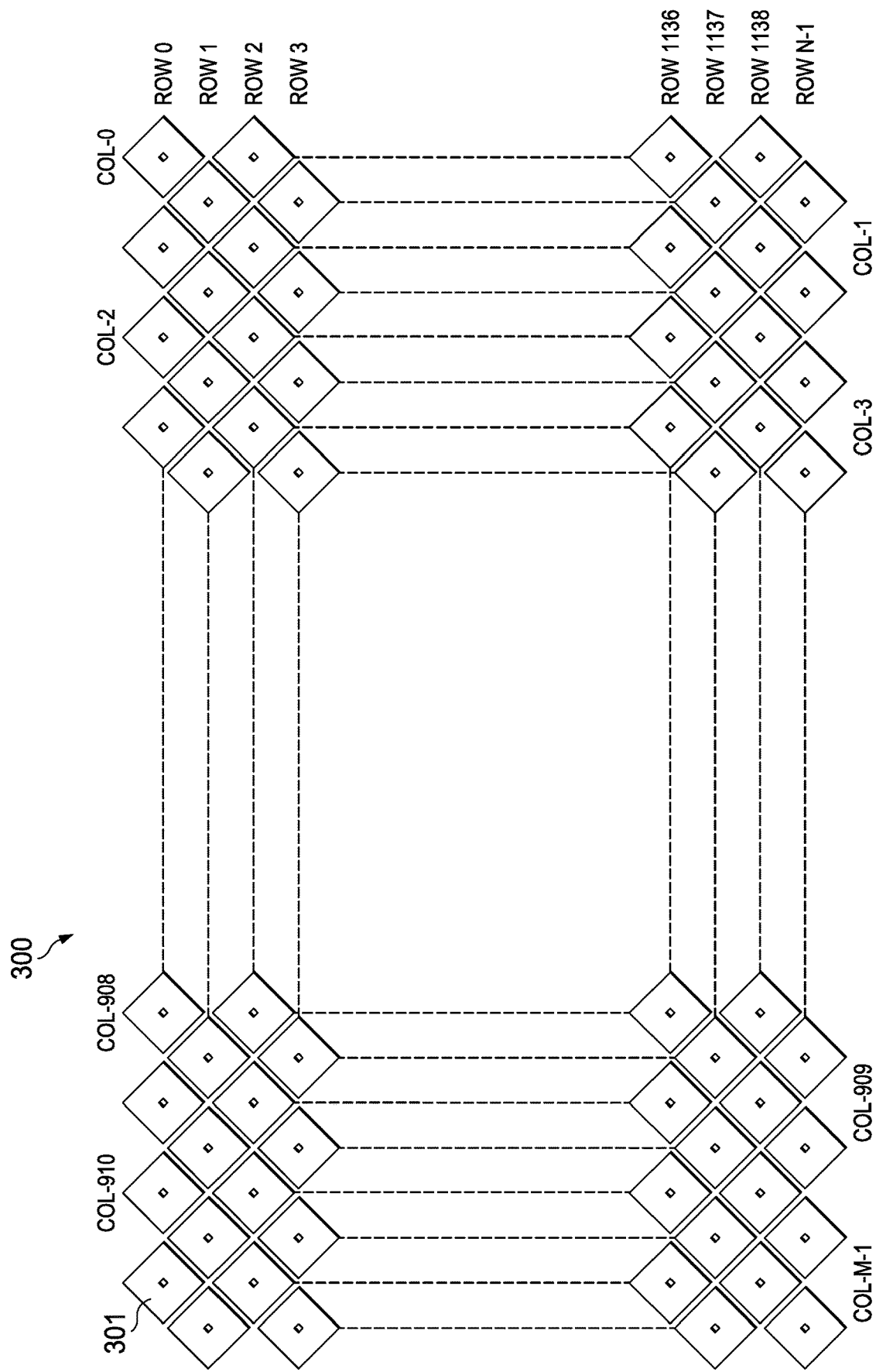
FIG. 3 is a plan view of a portion of a DMD having an array of micromirrors arranged in a diamond pattern with staggered rows.

FIG. 3 illustrates, in a plan view, a portion of a micromirror array 300 for a DMD device of the arrangements. The micromirrors 301 are positioned in a diamond pattern. The rows are numbered from 0 to N−1, where there are N rows, and N is a positive integer. In an example DMD device, there are 1140 rows, numbered from 0 to 1139. However devices can have a few rows to thousands or many more rows. The rows extend across columns in the array, the columns are numbered from 0 to M−1, where M is a positive integer. In an example M is 912, and the columns are numbered from 0 to 911. The micromirrors are arranged in a diamond pattern and in staggered fashion, aligned with the horizontal rows, so that micromirrors in adjacent rows are staggered with respect to each other. Note that, in the example of FIG. 3, for a given row of the diamond patterned array, there are only M/2 micromirrors, as the elements are staggered, covering one column of the memory cell array entirely and extending partially over the adjacent columns. The diagonals of the square micromirrors are aligned with the rows and aligned with the columns. The arrangement in FIG. 3 is a side diamond example where the illumination is directed from, for example, the left side of the array and is reflected towards the viewer of FIG. 3 at an ON, or OFF, tilt angle.

Figure 4:
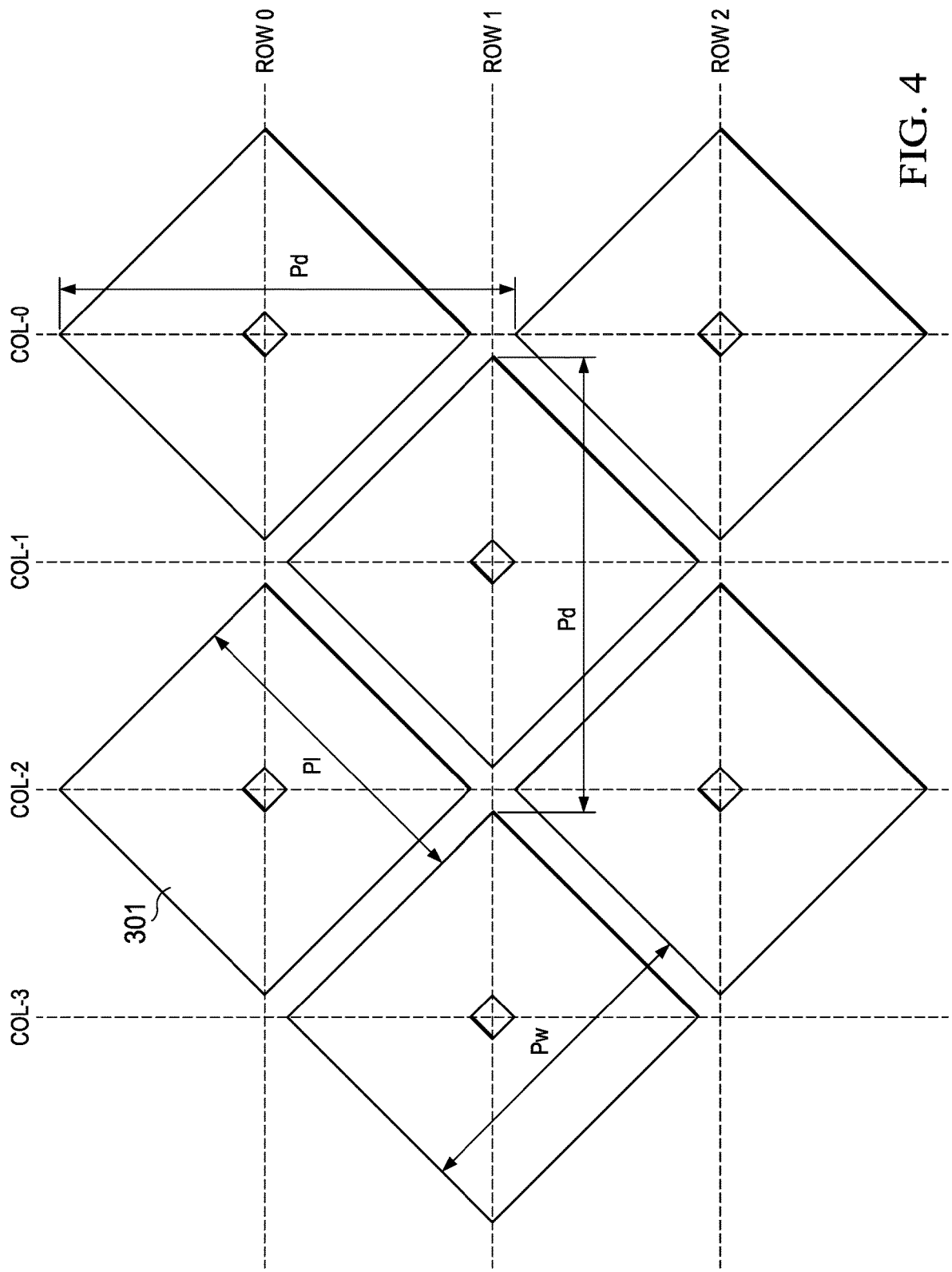
FIG. 4 is a plan view of a portion of an array of micromirrors in a diamond pattern showing pitch dimensions.

FIG. 4 is a close up of a portion of the diamond micromirror array to illustrate the pitch of the micromirrors 301. In FIG. 4, rows ROW 0, ROW 1, and ROW 2 are arranged horizontally (as FIG. 4 is oriented). Columns COL-0, COL-1, COL-2, COL-3 are shown oriented vertically as the figure is oriented and intersect the rows at a normal angle. The rows and columns correspond to the rows and columns of an array of memory cells (not shown) arranged in a Manhattan pattern, which lie beneath the micromirrors and are not visible in this figure. When fabricating an array of same sized replicated devices, to increase the number of units per area, a common pitch is often used to layout the devices efficiently. The pitch of equally spaced and repeatedly placed devices is the distance across one of the devices, which are repeated instances and are the same size, and includes a spacing distance that is needed between the adjacent devices. In FIG. 4, the diamond patterned micromirrors have several pitch distances. As shown in the figures, the pitch distances are aligned in different directions. As the square micromirrors are positioned in a diamond pattern, the width pitch Pw (width of a micromirror plus spacing) is shown diagonal to a row direction of rows ROW 0, ROW 1, ROW 2 (rows are oriented in a horizontal direction as shown in FIG. 4). The length pitch Pl, (length of a micromirror plus spacing) is normal to the width pitch, and at a diagonal to the row direction. The diagonal pitch Pd for the micromirrors extends along the row direction. Because the diamond patterned micromirrors are square, the same diagonal pitch Pd extends along a column direction, which is normal to the row direction.

Figure 5B:
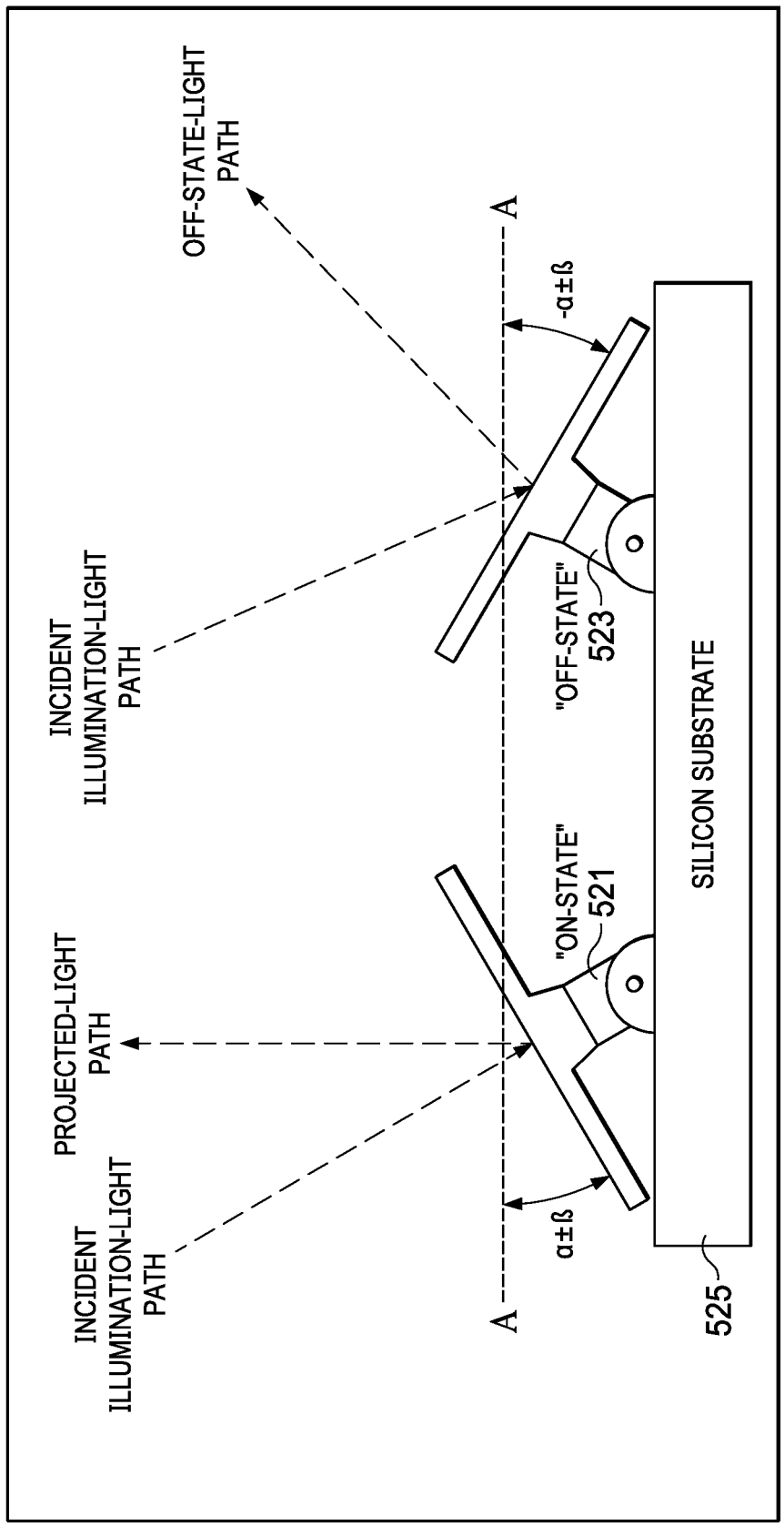

FIGS. 5A and 5B illustrate the operation of a portion 500 of the micromirrors in a DMD micromirror array. In FIG. 5A, a first group of micromirrors 501 is in the ON state and are shown as bright, indicating the light is being projected towards the viewer. Group 503 are micromirrors in an OFF state and are shaded dark, indicating the light is being reflected away from the viewer, and into a light trap (not shown in FIG. 5A). The illumination light 504 enters the array of micromirrors 301 from the left side (as oriented in FIG. 5A).

FIG. 5B shows the operation of an ON state micromirror and an OFF state micromirror of FIG. 5A in a cross sectional view taken along line A-A in FIG. 5A. The micromirrors 521 and 523 are shown as mirrors overlaying a silicon substrate 525. Micromirror 521 is in the ON state, and is tilted to a positive angle $+\alpha$ with a tolerance $+/-\beta$. In the example shown in FIG. 2, $\alpha$ can be 12 degrees, 17 degrees or another angle. The incident illumination light is reflected by the ON state mirror towards a projected light path. Micromirror 523 is in the OFF state, and is shown tilted to an angle $-\alpha+/-\beta$. The incident illumination light is then reflected away from the projection light path to an off state light path, and to a light trap (not shown). Using DMDs to modulate the intensity of the incident light is a subtractive process; if all of the micromirrors in an array are in the ON state for a given display time, all of the incident illumination light is reflected to a projection light path. For any micromirrors in the OFF state, the incident illumination light is reflected away from the projection light path. By loading bit map patterns onto the DMD, the intensity of the light is modulated, and images can be projected.

Figure 6:
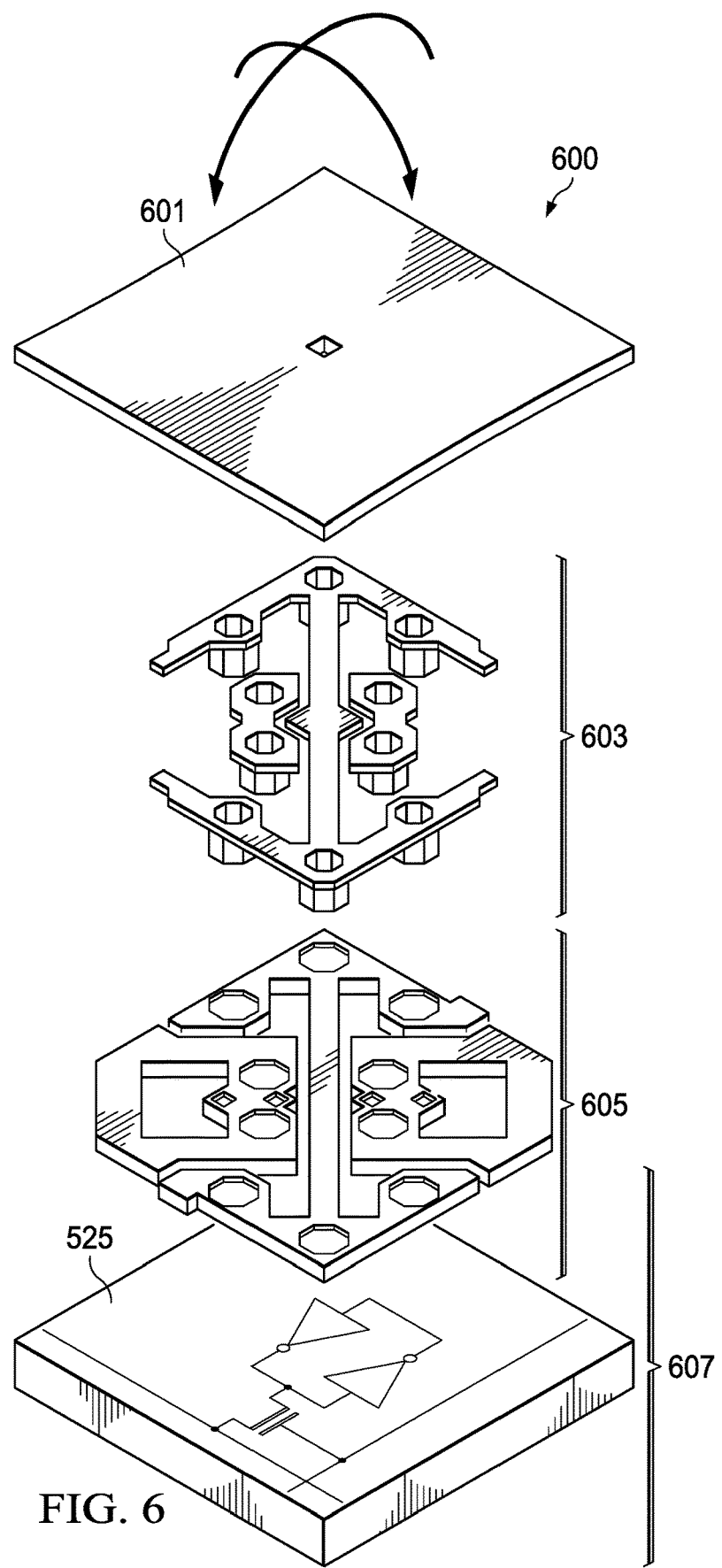
FIG. 6 illustrates, in an exploded view, elements of a micromirror.

FIG. 6 illustrates, in an exploded view, selected elements of a micromirror such as used in a DMD. In FIG. 6, the device 600 includes a micromirror 601. Micromirror 601 may be aluminum, and may have a reflective coating of aluminum, silver, gold, copper or alloys of reflective materials. The micromirror 601 is fabricated, using micro-electromechanical system (MEMS) processes that are similar to semiconductor fabrication processes, by depositing, patterning, and etching layers of metal, and depositing and removing sacrificial layers, to form the elements. Micromirror 601 lies over and is attached by a post (obscured by micromirror 601 in FIG. 6) to a torsion hinge assembly 603. Electrodes 605 are positioned between the memory cell 607 on a silicon substrate 525, and the torsion hinge assembly 603. The voltage output by the memory cell 607 corresponding to stored data is coupled to the electrodes 605. When the micromirror 601 is active, depending on the voltage from the memory cell that corresponds to the stored data, the electrodes 605 cause the micromirror 601 to tilt with the rotating motion of the torsion hinge assembly 603.

Figure 7:
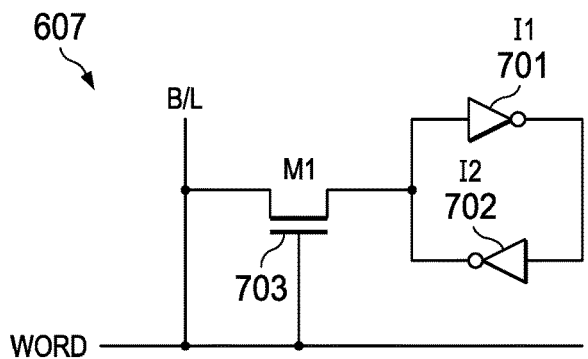
FIG. 7 is a circuit diagram for an example memory cell.

FIG. 7 is a circuit diagram detailing an example circuit for the memory cell 607. The memory cell 607 is a static random access memory (SRAM) cell. In the example shown in FIG. 7 a "5 T" SRAM cell is used, meaning the cell has five transistors, four for two inverters I1 and I2, and one for transfer gate M1. Other SRAM cells may be used, such as 6 T cells or 8 T SRAM cells. The use of a 5 T cell reduces memory cell area when compared to other types of SRAM cells; however in alternative arrangements, these other types of SRAM cells, such as 6 T or 8 T SRAM cells, may be used. Inverters I1 (701) and I2 (702) are in a cross coupled arrangement that will, unless disturbed, reinforce and maintain a "0" or "1" logic state. When the WORD line is active, a voltage on the word line causes transfer gate M1 (703) to turn on and couple the memory cell to the bit line B/L. During a cell READ operation, the data stored in the memory cell is coupled to the bit line B/L. The bit line is coupled to a corresponding column line by a column control block in the memory array, and then read out of the DMD (see FIG. 8 and the description below). During a WRITE operation, the data placed by a write control block on the bit line B/L is coupled to the memory cell 607 (see FIG. 8 and the description below), and the voltage on the bit line B/L is at a level sufficient to flip the previous state of the memory cell (if it is different from the current stored state) to store the write data presented on the bit line in the memory cell. The WORD line then falls, disconnecting the bit line from the inverters, and storing the data in the cross coupled inverter pair. The WORD line for each memory cell has a load of the transfer gate M1 (703). In an example, there are thousands of memory cells on each row of the memory array. The WORD line is driven by a row driver circuit that has sufficient drive strength to turn on the transfer gates in all of these memory cells simultaneously. Also, because the memory cell 607 outputs voltages sufficient to operate the micromirror device positioned over and coupled to the memory cell 607, a high voltage is used in the memory array, for example 10 Volts. To turn on the transfer gates, the WORD line rises to a high voltage of about 10 Volts. Other circuitry in the DMD can operate at a complementary metal-oxide-semiconductor (CMOS) logic level voltage, for example 3.3 Volts, 1.8 Volts, 1.2 Volts, or less.

Figure 8:
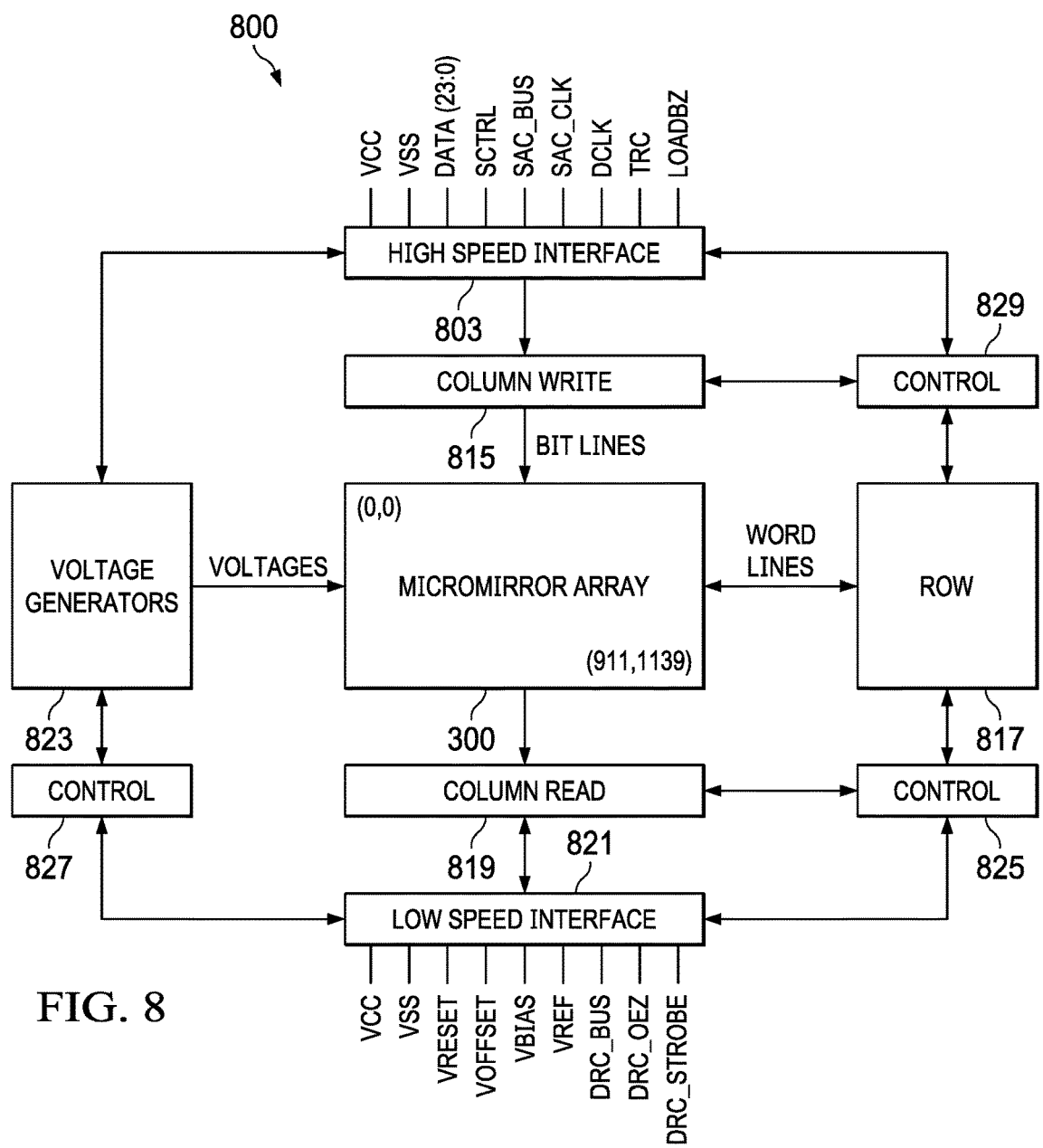
FIG. 8 is a block diagram for an example DMD device.

FIG. 8 is a block diagram for an example DMD device 800. In FIG. 8, the micromirror array 300 is an array with 912 columns (0-911) and 1140 rows (0-1139). Each row of micromirrors has diamond patterned micromirrors, and the micromirrors are staggered along the adjacent rows. Digital data signals (labeled DATA (23:0)) are clocked into the DMD device 800 at the HIGH SPEED INTERFACE block 803 by a data clock signal DCLK. Additional signals to the HIGH SPEED INTERFACE block 803 are serial bus control input SCTRL, stepped address control serial bus data input SAC_BUS, and the stepped address control serial bus clock SCLK; the HIGH SPEED INTERFACE block 803 allows control of the control blocks 825, 827 and 829; these control blocks control addressing the memory cells of micromirror array 300, writing, and reading the memory cells in micromirror array 300. Input TRC is a data toggle rate control line. The signal LOADBZ is a DMD data load signal input that is one of the signals that allows a DMD controller (not shown) to control the DMD 800. Inputs to the HIGH SPEED INTERFACE 803 also include voltages VCC and VSS. Inputs to the LOW SPEED INTERFACE 821 include several voltages required by the DMD 800 including VCC, VSS, VBIAS, VREF, and VOFFSET. The micromirrors in array 300 are clocked under control of a DMD controller, the signals DRC_BUS, DRC_OE, and DRC_STRB are inputs for a second serial bus for controlling the micromirror reset operations. The bit lines BIT LINES are coupled to column lines at the COLUMN WRITE block 815, and the row drivers inside ROW block 817 drive the WORD LINES that are coupled to each of the 1140 rows in the micromirror array 300. When data from the memory cells is read, the bit lines are coupled to column lines by the COLUMN READ block 819, and can be read from an external device coupled to the LOW SPEED INTERFACE block 821.

Portions of the DMD device 800 operate at logic level voltages, for example 1.2V-3.3 Volts. However, the micromirror array 300 and the corresponding memory cells must operate at higher voltages, for example 10 Volts. This is because the voltage output by a memory cell in the micromirror array 300 (corresponding to stored data in the cell) has to drive the torsion hinge assembly and tilt the corresponding micromirror. To interface from the logic level voltages, for example of the high speed and low speed interface (blocks 803 and 821, respectively) to the array voltages, for example the bit lines from the COLUMN WRITE block 815, and the WORD LINES from the ROW block 817, level shift circuits are used. The level shift circuits are within ROW block 817, and in the COLUMN WRITE block 815, and the voltages needed for these low voltage and high voltage circuits, labeled VOLTAGES, are generated by the VOLTAGE GENERATOR block 823.

Figure 9A:
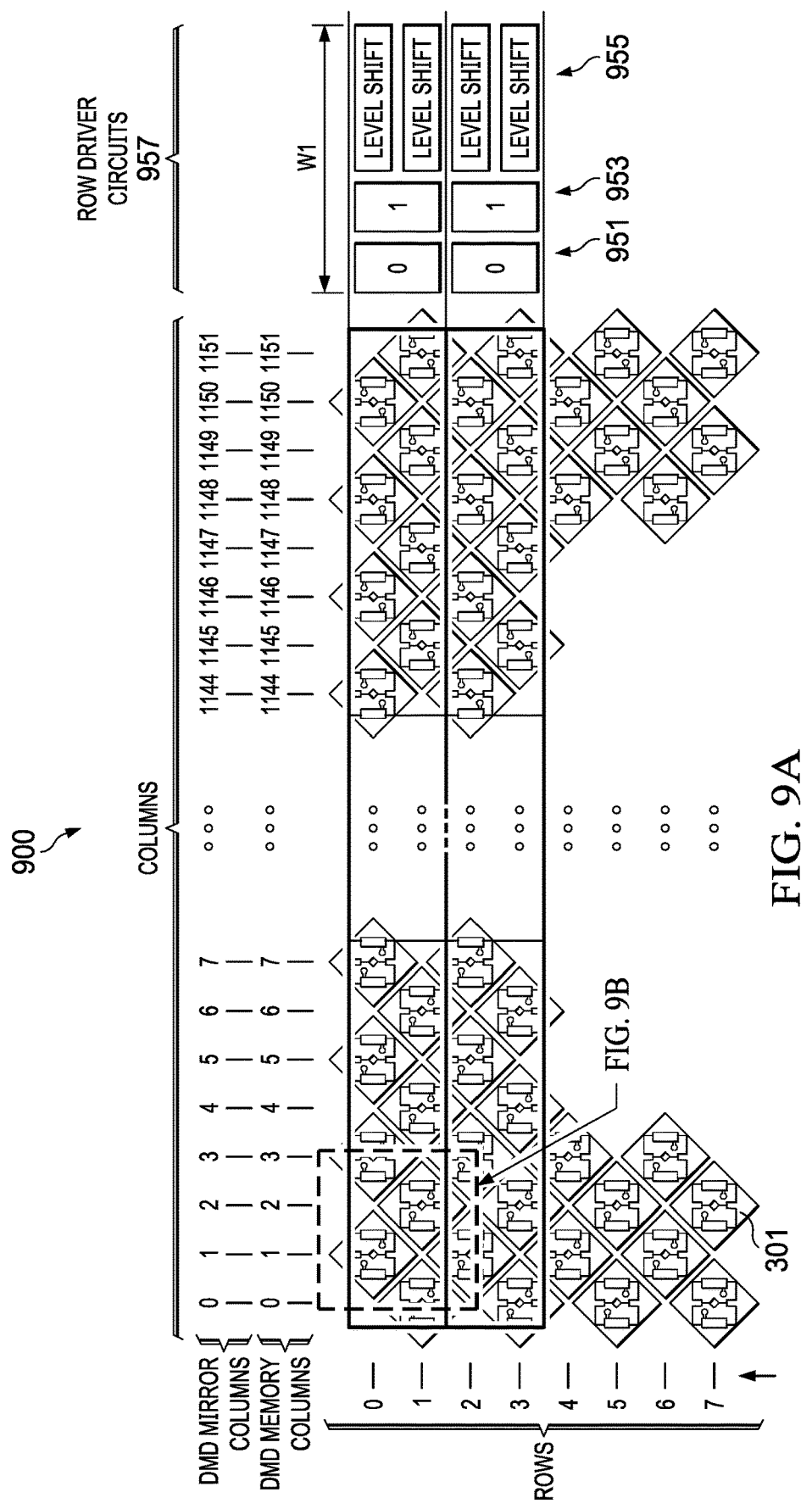
FIGS. 9A-9B illustrate a plan view and a close up view, respectively, of an array of micromirrors overlaying an array of memory cells.
Figure 9B:
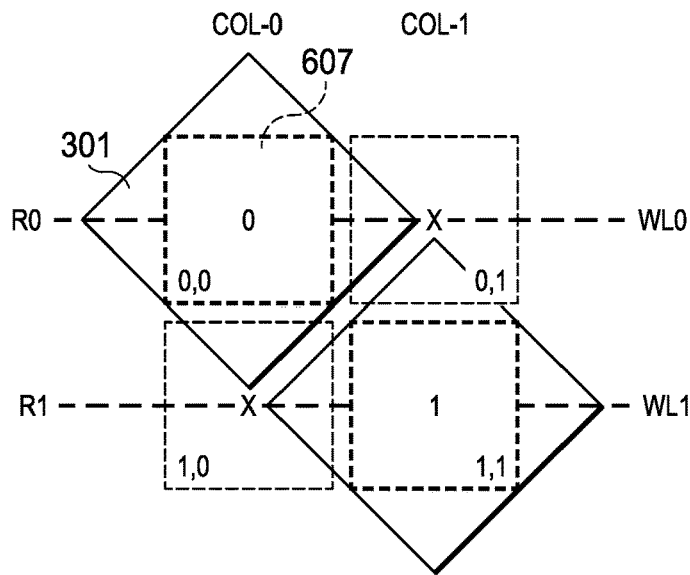

FIGS. 9A and 9B illustrate, in a plan view and a close up view, an array of micromirrors and memory cells 900 in an example arrangement using a DMD. There are M columns of memory cells, in the example of FIG. 9, M=1152 columns that are shown in part, and M columns (0-1151) that are coupled to micromirrors. However, due to the staggered diamond arrangement, along any row of memory cells with M columns, in this example there are only M/2 micromirrors, or fewer. For an example row such as row 0 in the figure, there are M/2 micromirrors positioned over and controlled by alternating memory cells, 1, 3, 5, etc. with the micromirrors partially overlaying the memory cells, 0, 2, 4, etc. Because the micromirrors are in a staggered diamond pattern, the odd rows such as row 1 in the figure, have micromirrors that are positioned over and controlled by the memory cells 0, 2, 4, etc. and the alternating memory cells are only partially covered by micromirrors, and are not used for controlling memory cells, for example memory cells 1, 3, 5, etc. in row 1 are not used to control micromirrors.

FIG. 9B illustrates in a close up view of the array such as that of FIG. 9A the positions of the memory cells 607, arranged in a Manhattan pattern, and the micromirrors 301, in an overlaying diamond pattern, for two example rows labeled R0, R1, at two column locations labeled COL-0, COL-1. Memory cell 0, 0 stores a logic "0" value. The memory cell 1, 1 stores a logic "1" value. The remaining memory cells at location 0, 1 and 1, 0 are not overlapped by a corresponding micromirror 301, and do not control a micromirror, the data stored in these cell is a don't care or "x" state. The memory cells 0, 0 and 1, 1 are staggered from one another in adjacent rows in correspondence with the staggered micromirrors, that are also in adjacent rows. Word lines WL0 and WL1 correspond to the row lines R0, R1, memory cells along row R0 are coupled to word line W0, and memory cells along row R1 are coupled to word line W1.

In FIG. 9A the plan view shows that the memory array has row driver circuits 957 with row drivers 951, 953 placed at one end of the rows, and these are repeated for each row. As shown in FIG. 9A, the row driver circuits 957 are as long, in the column direction, as two rows of memory cells are in the column direction. Each pair of rows has, at one end, a pair of row drivers 951, 953 to drive word lines W0, W1 of the pair of rows. Each pair of rows of the row driver circuit 957 also has a pair of level shift circuits 955, one for each row. While the row drivers are arranged to fit, in the column direction, in the same pitch as two rows of the memory array, the row driver circuits 957 also extend in the row direction to a width W1. In an example device fabricated in a semiconductor process, this width W1 is 1 millimeter. Since each pair of rows has the pair of row drivers that extend 1 millimeter away from the end of the memory cell array, the row driver circuits and level shift circuits in this example require substantial area on the semiconductor substrate.

Figure 10A:
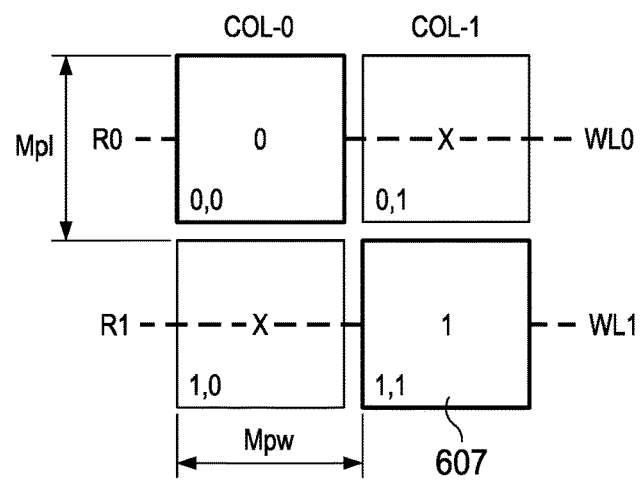
FIGS. 10A-10B illustrate in plan views the pitch distances for example memory cells and micromirrors.
Figure 10B:
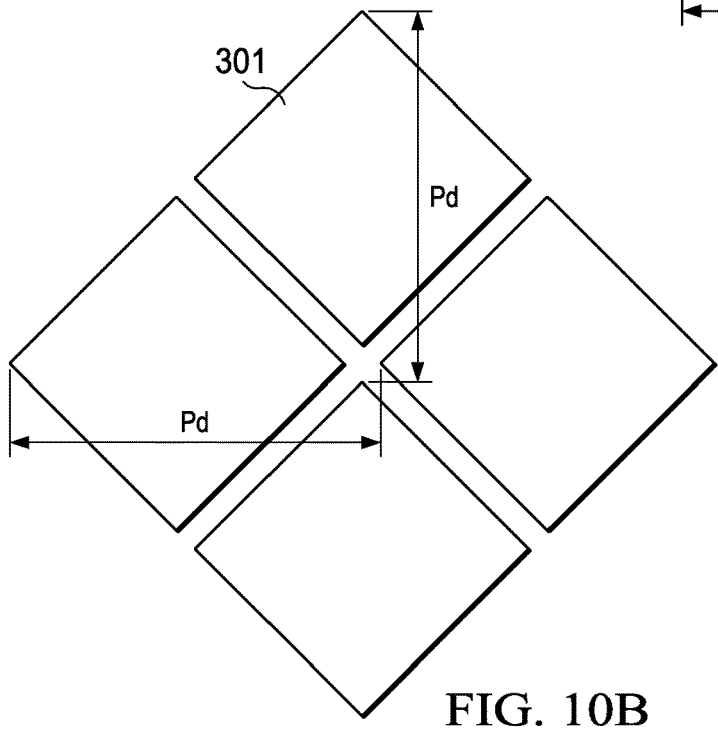

FIG. 10A illustrates the pitch distances for the memory cells in the array, and FIG. 10B illustrates the pitch distances for the diamond patterned micromirrors in the array. In FIG. 10A four memory cells 607 are shown, at row R0, row R1, at column COL-0, column COL-1, so that the memory cells have row, column addresses 0,0, 0,1, 1,0, and 1,1. As shown in FIG. 10A, the repeated instances of the memory cells have common pitch, in the column (length) direction labeled Mpl, and in the row (width) direction labeled Mpw. In the examples shown, the memory cells are square, so that Mpl=Mpw. FIG. 10B shows a corresponding pitch diagram for four micromirrors 301 that will overlay the memory cell array. The micromirrors are in a diamond pattern and have a common diagonal pitch Pd in both the row (width) and column (length) directions. In the arrangements the diagonal micromirror pitch Pd is approximately twice the memory cell pitch Mpw, which is equal to Mpl (see FIG. 10A). This may be considered a 2×2 arrangement, in that each micromirror covers one memory cell and the area of a second memory cell, so that two memory cells in adjacent rows cover portions of four memory cells. Other arrangements may have relatively larger micromirrors, and each may cover a multiple of memory cells, for example 4×4, 8×8, even 16×16. In these alternative arrangements, additional redundancy in the memory array is present. In the example of FIGS. 10A-10B, the micromirror pitch has a tolerance, and for a pitch ratio of about 2 between the micromirror pitch Pd and the memory cell pitch Mpw, the ratio can vary between 1.8 to 2.2. In alternative arrangements, the number of micromirrors can be less than half the number of memory cells, for example there could be one micromirror for every four memory cells in a row, increasing the number of redundant columns. The micromirror pitch Pd in this alternative example could be about four times the memory cell pitch Mpw. Other arrangements could be formed using a larger ratio of micromirrors to memory cells. The memory cells between the micromirrors are not used to control a micromirror. This is reflected in FIG. 10A by marking the state of memory cells 0, 1 and 1 0 as "x" for a logic "don't care" state. Because these memory cells are not used to address micromirrors, the state of these cells has no optical effect on the system, and the data value stored there does not matter.

Figure 10C:
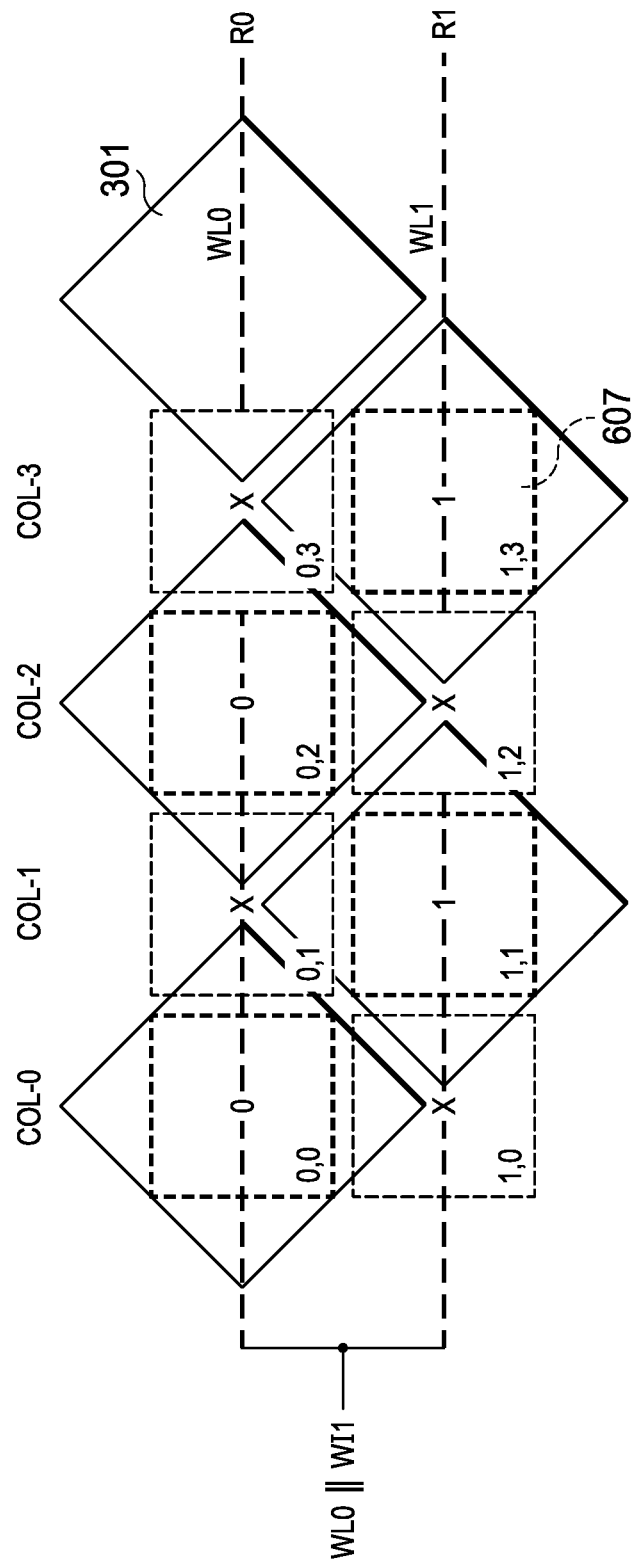
FIG. 10C illustrates two rows of memory cells and overlaying micromirrors with a shared word line connection.

FIG. 10C illustrates one part of an arrangement for a DMD. In FIG. 10C, two rows of memory cells R0, R1 are shown with four columns COL-0 to COL-3. There are five micromirrors (micromirrors 301) shown overlaying the memory cells 607 in the staggered diamond arrangement. As shown in FIG. 10C, every other memory cell along a row is not used for controlling a micromirror element, so that the data value stored in those cells is a "don't care" or "X". Further, the memory cells that are covered by and which control a micromirror are staggered between adjacent rows, in correspondence with the staggered micromirrors. In FIG. 10C, for an even row, such as row R0, the memory cells that control the micromirrors are those in even columns (COL-0, COL-2, etc.). For an adjacent odd row, such as R1, the memory cells that control the micromirrors are in odd columns (COl-1, COL-3, etc.). In the arrangements, the two word lines WL0 and WL1 are tied together to form a single word line WL0||WL1. Because the arrangements have column redundancy in the memory array, every other memory cell along a row is not used to effect the optical output, so that two adjacent rows may be accessed with the same word line signal. There is no conflict or loss of data because although the cells in two rows are selected by the combined word line WL0||WL1, only one memory cell in a selected row affects a particular column during a memory read or memory write operation.

In a DMD of the arrangements, an array of micromirror elements in rows and columns is arranged in a diamond pattern with staggered positions in alternating rows. The micromirrors are arranged overlaying a memory array. Each row of the memory array has M memory cells, as described above. Each row of micromirrors has a number of micromirrors that is M/2 or fewer. The micromirrors are larger in area than the underlying memory cells, so that there are fewer micromirrors than memory cells. In the arrangements, the memory cells are positioned in a Manhattan pattern. A memory cell in a row of memory cells is aligned with adjacent memory cells in a row direction and intersects columns of memory cells at a normal angle. Similarly each column of memory cells is aligned along the column direction that is normal to the row direction, so that along a column adjacent memory cells are aligned across the rows. In the arrangements, the number of memory cells along a row of memory cells, M, is least twice the number of micromirrors along the row. The diamond patterned micromirrors have a diagonal pitch Pd along the rows; this pitch is greater than the memory cell pitch Mpw along the rows (see FIG. 11A). The diamond patterned micromirrors are placed so that the memory cell that controls a micromirror is completely covered by the micromirror, the micromirror is larger than the memory cells so that a portion of each memory cell adjacent to the controlling memory cell is also covered by a portion of the diamond patterned micromirror. For example, the micromirror diagonal pitch Pd may be 1.8 to 2.2 times the width pitch Mpw of the memory cells. The memory cells that control micromirrors alternate with other memory cells along a row of memory cells, and are staggered between adjacent rows of memory cells in correspondence with the staggered pattern of the diamond patterned micromirrors along the rows.

In the arrangements, column redundancy is present in the memory array. Because the diamond pattern of the micromirrors is staggered, and because the micromirrors are larger than the memory cells (in the examples illustrated, the pitch Pd of the micromirrors about twice the pitch Mpw of the memory cells), every other memory cell along a row in the array is not used to control a micromirror. There is a staggered pattern between memory cell rows, so that for an example first row, the memory cells in odd columns are not used to control a micromirror, while for an adjacent second row, the memory cells in even columns are not used to control a micromirror. Due to the column redundancy in the memory array, in the arrangements two adjacent rows of memory cells can be written, or read, in a single row access cycle, reducing write and read cycle time. Further, two word lines of the memory array in two adjacent rows can be coupled together as a shared word line. The shared word line can be driven by a shared row driver circuit. Using a shared row driver circuit for each pair of rows, reduces the number of row driver circuits by half, reducing the total area needed for the DMD device. This reduction in area results in more units per wafer, reducing cost. In a further arrangement, the two rows on a shared word line and the shared row driver can also share a level shift circuit. The level shift circuit shifts logic level voltages on row select inputs received from logic level control circuitry and outputs row driver select output signals to the row driver circuit, which is at the higher array voltage. The level shift circuit raises the signal voltage from a logic level voltage to the voltage needed by the row driver circuit.

Figure 11A:
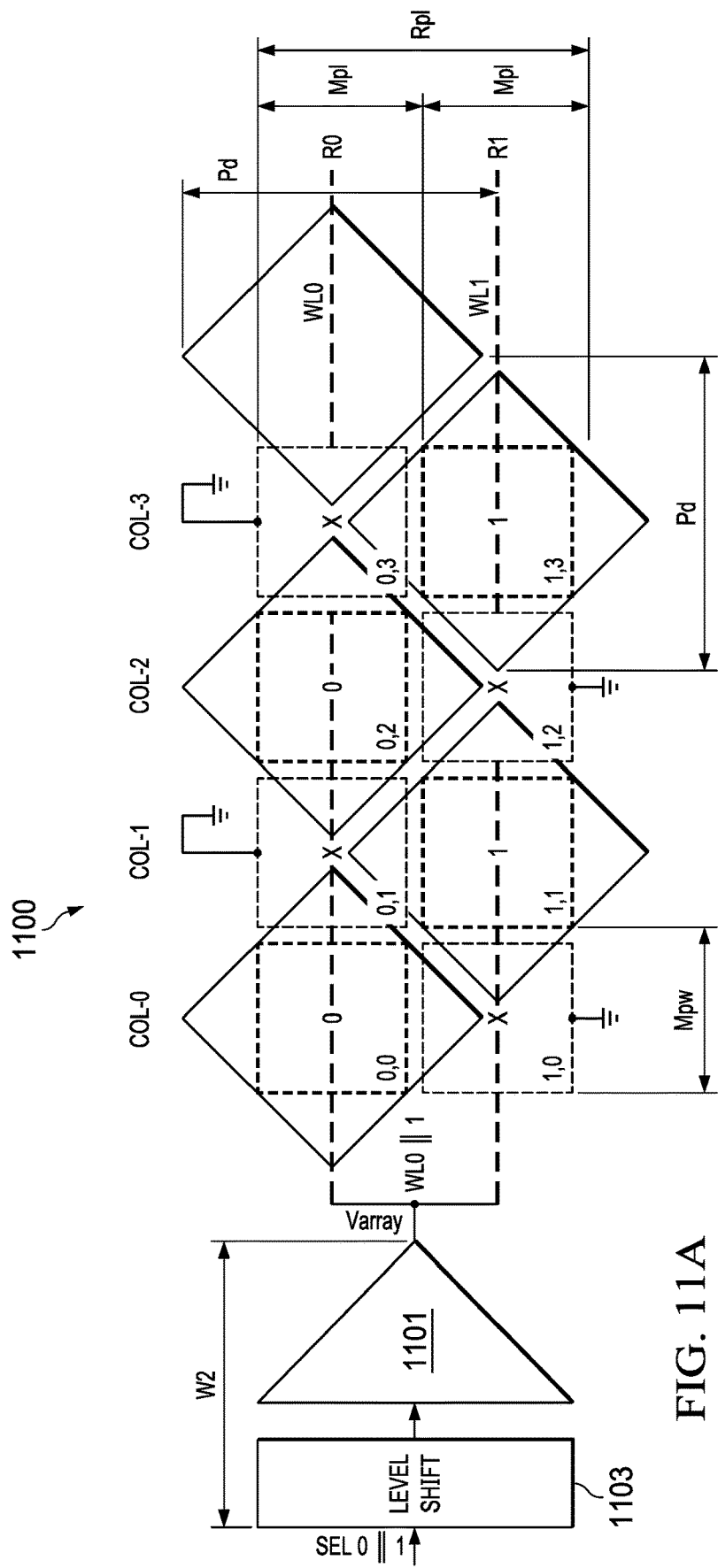
FIG. 11A illustrates in a block diagram an arrangement having a shared row driver circuit coupled to a word line shared by two rows of memory cells and the overlaying micromirrors.

FIG. 11A illustrates is a block diagram for an arrangement micromirror array 1100 with shared row driver circuits and shared level shift circuits for adjacent rows. In FIG. 11A, a single row driver circuit 1101 is coupled to a shared word line WL0||1 that is coupled to the pair of word lines WL0 and WL1, which are coupled to an even and odd row pair of rows R0 and R1, respectively. The two word lines WL0, WL1 are always operated together as WL0||1. When a select signal for either row (labeled SEL 0||1) is received by the shared level shift circuit 1103 from control circuitry, the level shift circuit 1103 outputs a row driver select signal to the row driver circuit 1101, which outputs a voltage (voltage Varray, which may be 10 Volts, for example) on the shared word line WL0||1 which is coupled to both word lines WL0 and WL1. By using a single row driver circuit 1101 and a single level shift circuit 1103 for adjacent pairs of rows throughout the memory array, substantial area is saved. The length pitch of the row driver and level shift circuits Rpl in the column direction matches twice the pitch Mpl of two rows of memory cells. The width W2 of the row line circuitry shown in FIG. 11 is greatly reduced for the combined row driver circuit and level shift circuit when compared to the width W1 for the separate row driver and level shift circuits shown in FIG. 9. In addition to the area savings caused by the smaller width W2 for the shared row driver circuit and level shift circuit for the adjacent pairs of rows, as described above, power consumption can be further reduced by not connecting the word lines to the unused memory cells. This is indicated in FIG. 11A by the ground connections to the unused memory cells. By not connecting the word line connections to the unused memory cells, the capacitive loads on the word lines are reduced by about half, since half the transfer gates in the memory array are no longer connected to the row driver circuits.

Figure 11B:
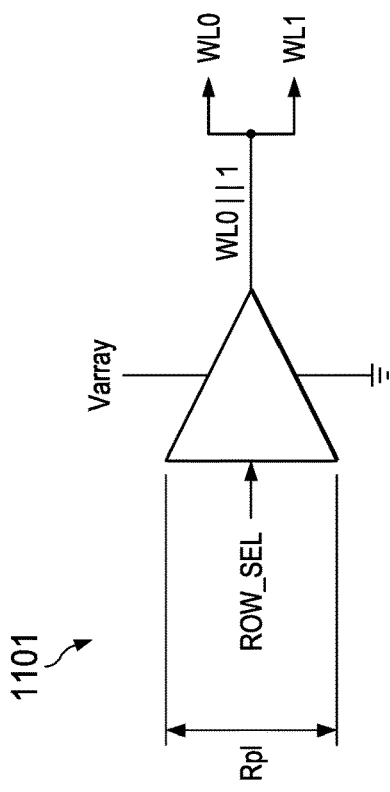
FIG. 11B illustrates in a circuit diagram an example row driver circuit.

FIG. 11B is a circuit diagram for the row driver circuit 1101. The row driver circuit is a non-inverting or inverting amplifier supplied by the voltage Varray. The input is the signal ROW_SEL received from a level shift circuit. The output is a signal on a shared word line WL0||1 that is coupled to both the word line WL0 for the row R0, and the word line WL1 for the row R1.

Figure 11C:
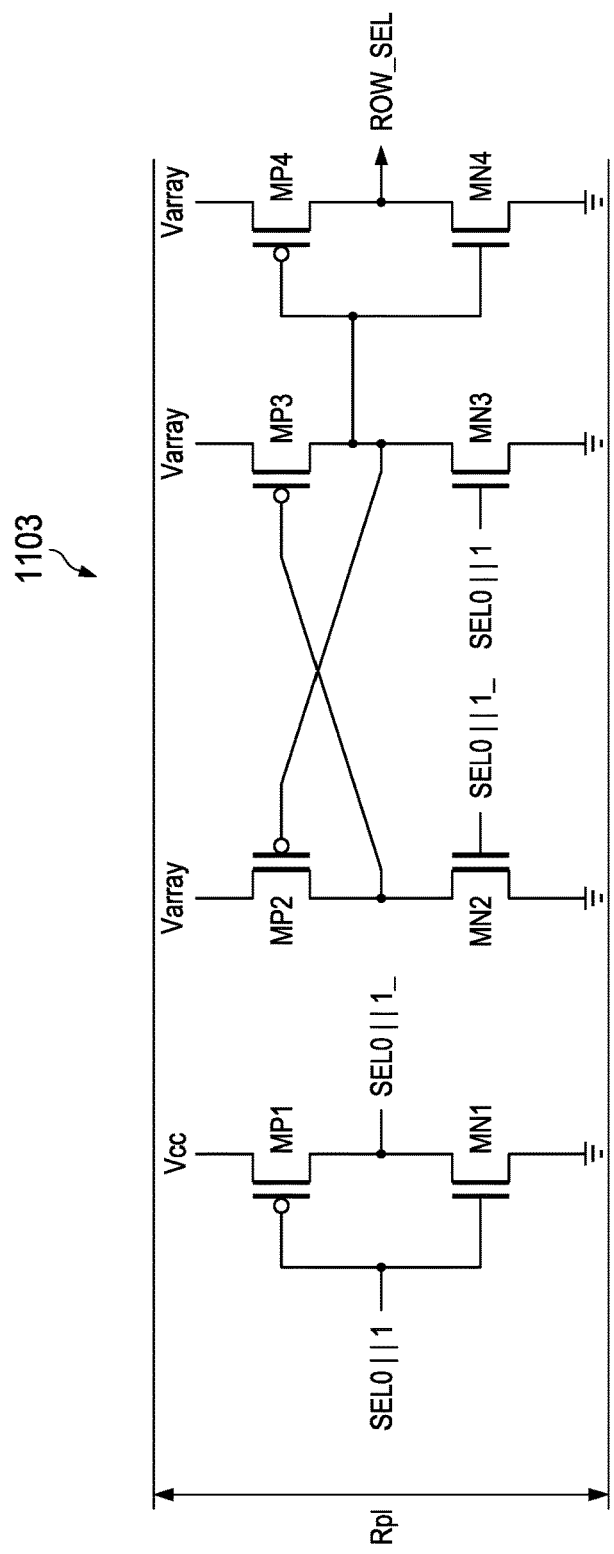
FIG. 11C illustrates in a circuit diagram an example level shift circuit.

FIG. 11C is a circuit diagram for the level shift circuit 1103. The level shift circuit 1103 receives a logic level input row select signal SEL 0||1. An inverter formed from transistors MN1 and MP1 outputs an inverted select signal SEL 0||1_. A latch circuit of N and P type metal oxide semiconductor (MOS) transistors receives the select signals SEL 0||1 and SEL 0||1_. The latch circuit outputs a signal at the voltage Varray, the cross coupled P type transistors MP2, MP3 pulling one of the nodes NH and NL to the higher voltage Varray, which may be 10 Volts or more. The N-type transistors MN2, MN3 are sized larger than the P-type transistors MP2, MP3, so that the latch state can be changed in response to a voltage change in the latch inputs SEL 0||1 and SEL 0||1. An output inverter circuit of transistors MP4, MN4 drives the output signal ROW_SEL at the higher voltage Varray. The example level shift circuit 1103 can be replaced with various other level shift circuits that raise a logic level signal to a higher voltage signal. The level shift circuit 1103 has a pitch length Rpl in the column direction that is the row driver pitch Rpl, and is about twice the memory cell length pitch Mpl, so that the row driver circuit 1101 and level shift circuit 1101 take the pitch that two rows of memory cells takes. Using the pitch Rpl for shared circuitry that is coupled to two rows of memory cells with pitch Mpl makes the layout of the memory array efficient.

Figure 12:
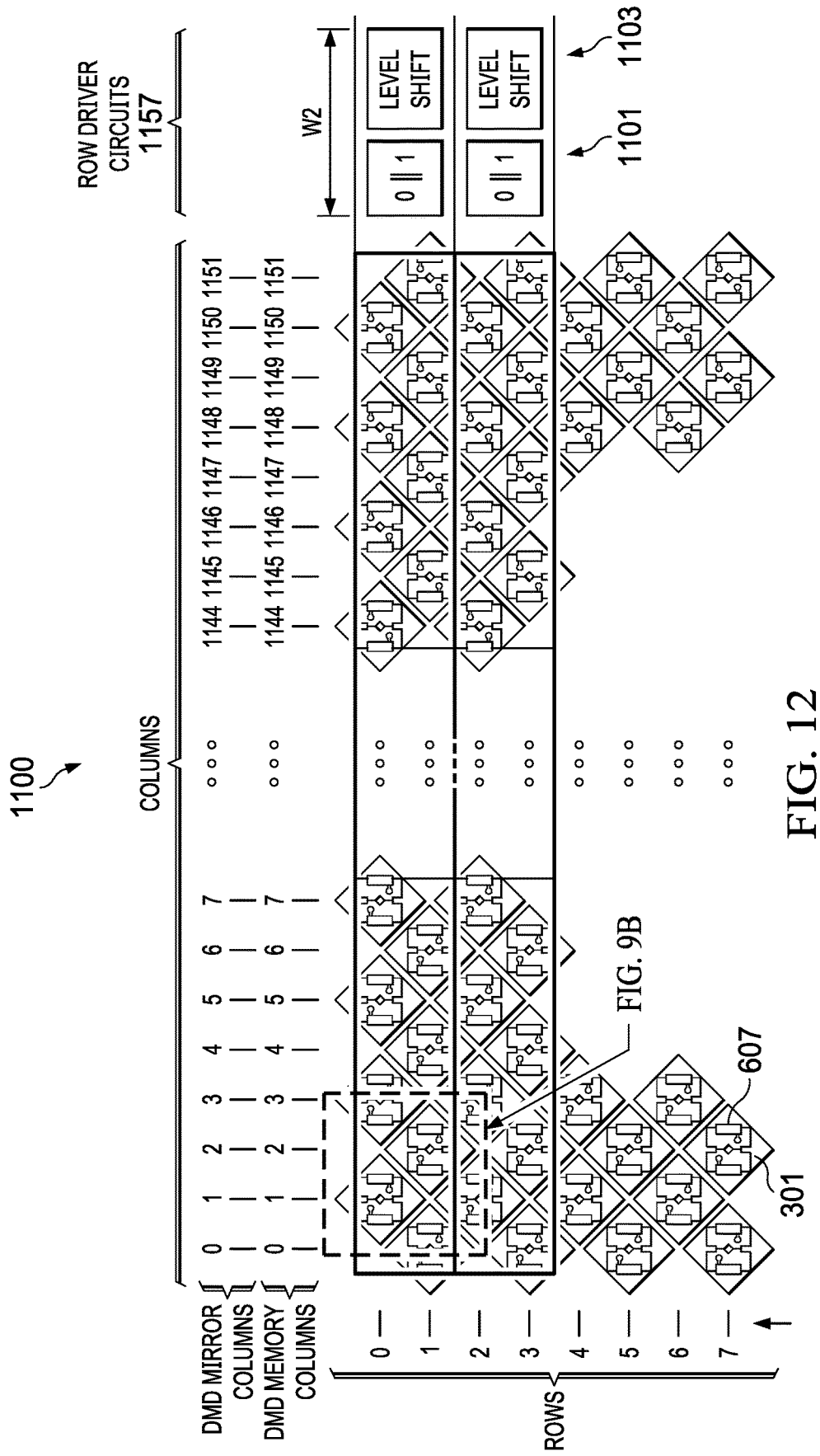
FIG. 12 illustrates in a plan view a portion of a DMD using the arrangement of FIG. 11.

FIG. 12 is a plan view of the DMD with a micromirror array 1100 shown in FIG. 11A. Row driver circuits 1157 include a row drivers 1101 and level shift circuits 1103 placed at the side of the array of memory cells 607, a shared row driver 1101 is coupled to pairs of word lines for adjacent rows on a shared word line connection, as shown in FIG. 11A, for each pair of rows. A level shift circuit 1103 is coupled to the row driver 1101 for each pair of rows, the level shift circuit and the row drivers have twice the pitch in the column direction as the memory cells in the column direction. The width W2 is substantially reduced when compared to the arrangement in FIG. 9 where a separate row driver and level shift circuit was used for every row of memory cells. In an example semiconductor process, the width W2 was reduced from 1 millimeter to 600 microns by use of the arrangements, a 40% improvement. The width W2 may be between 500 microns and 700 microns, for example 600 microns. The die area reduction due to the combined row driver and level shift circuits was about 8 percent for a DMD device made in an example semiconductor process when using the arrangements. In an example semiconductor process, this area reduction accounted for an increase of 8 devices per wafer. Note that in an arrangement the unused memory cells are still fabricated. The size of the memory cells is quite small, in one example the memory cell pitch Mpw (width along the row direction) of the SRAM cells is about 5.6 microns. To maintain planarity in the metal and dielectric layers during fabrication of the devices on a semiconductor substrate, maintaining approximately uniform metal density at each metal level fabricated over the substrate is important. By fabricating the transistors and conductors uniformly for all of the memory cells, both used and unused memory cells, across the memory array, the planarity is maintained.

Figure 13:
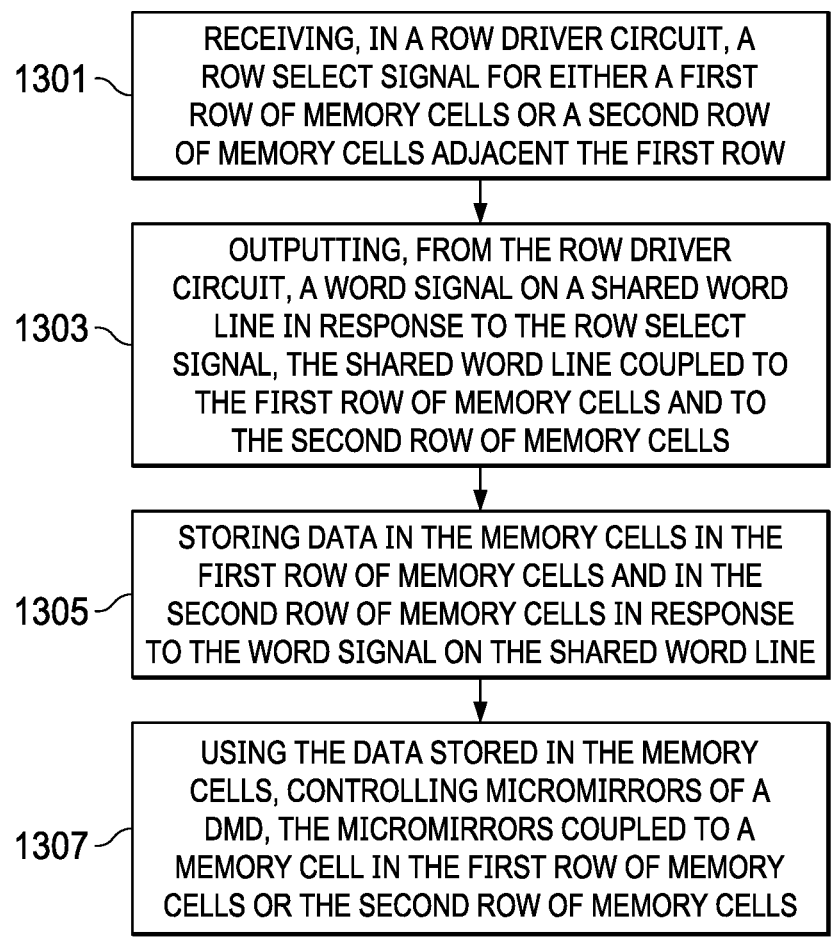
FIG. 13 illustrates in a flow diagram a method arrangement.

FIG. 13 is a flow diagram illustrating a method arrangement. At step 1301, a row select signal is received in a row driver circuit for either a first row of memory cells or a second row of memory cells adjacent the first row. At step 1303, the row driver circuit outputs a word signal on a shared word line in response to the row select signal, the shared word line is coupled to the first row of memory cells and to the second row of memory cells. At step 1305, the method continues by storing data in the memory cells of the first row of memory cells and in the second row of memory cells in response to the word signal on the shared word line. At step 1307, the method continues by using the data stored in the memory cells and controlling micromirrors of a spatial light modulator, the micromirrors coupled to a memory cell in the first row of the memory cells or the second row of memory cells. In this manner, two adjacent rows of memory cells are coupled to a shared word line and to a shared row driver circuit, and the data can be stored in the two rows of memory cells at the same time and used to control the micromirrors of the spatial light modulator, as described above.

In the arrangements, a DMD has a memory array with memory cells arranged in rows and columns in a Manhattan pattern. Micromirrors are arranged over the memory cells in a diamond pattern, with the diagonals of the micromirrors aligned with the rows and columns of the memory array. The number of memory cells along a row in the memory array exceeds the number of micromirrors along the row. Adjacent rows of memory cells in the memory array are coupled to a shared word line. The shared word line is driven by a row driver circuit that is shared between adjacent rows of memory cells. A shared level shift circuit is coupled to the shared row driver circuit for each pair of rows.

Although the example illustrative arrangements have been described in detail, it should be understood that various changes, substitutions and alterations can be made herein without departing from the spirit and scope of the present application as defined by the appended claims. Accordingly, the appended claims are intended to include within their scope processes, machines, manufacture, compositions of matter, means, methods, or steps that provide equivalents to the examples disclosed.

What is claimed is:

1. A system, comprising:
   an illumination source configured to produce light; and
   a digital micromirror device (DMD) optically coupled to the illumination source, the DMD configured to receive the light and to modulate the light, the DMD comprising:
      a semiconductor substrate;
      an array of memory cells in rows and columns on the semiconductor substrate, the rows and columns intersecting at normal angles, the memory cells coupled to word lines along the rows, pairs of word lines of for corresponding pairs of rows of the memory cells coupled to form shared word lines; and
      an array of micromirrors overlaying the array of memory cells, the micromirrors in a diamond pattern, the micromirrors being square, and the micromirrors having a first diagonal aligned with the rows and a second diagonal aligned with the columns, the micromirrors overlaying respective memory cells, a number of micromirrors along a row of memory cells being less than a number of memory cells along the row.

2. The system of claim 1, wherein for a row of the memory cells, alternating memory cells along the row are alternately coupled to a micromirror and not coupled to a micromirror.

3. The system of claim 1, wherein the micromirrors are in staggered rows.

4. The system of claim 1, and further comprising row driver circuits coupled to corresponding shared word lines, the row driver circuits configured to output voltages on the corresponding shared word lines to turn on transfer gates in memory cells in adjacent rows.

5. The system of claim 4, and further comprising a level shift circuit configured to receive a row select signal at a first voltage to select either row of a pair of rows coupled to a shared word line of the shared word lines, and the level shift circuit configured to output a row driver select signal at a second voltage to the corresponding row driver circuit coupled to the shared word line, wherein the second voltage is higher than the first voltage.

6. The system of claim 4, wherein the memory cells have a first pitch in a direction parallel to the columns, and the row driver circuits have a second pitch in the direction, the second pitch between 1.9 times the first pitch and 2.1 times the first pitch.

7. The system of claim 1, wherein the memory cells are static random access memory cells.

8. The system of claim 1, wherein a number of memory cells along a row in the array of memory cells is a positive integer M and a number of micromirrors along the row is M/2.

9. A device, comprising:
a semiconductor substrate;
a memory array on the semiconductor substrate, the memory array comprising rows and columns of memory cells in a Manhattan pattern, the memory cells having a pitch in a direction along the columns; and
an array of micromirrors in a diamond pattern over the memory cells, the micromirrors coupled to corresponding memory cells, the micromirrors having a diagonal pitch length in the direction along the columns that greater than the pitch of the memory cells.

10. The device of claim 9, wherein the rows of the memory cells are coupled to corresponding word lines, the memory cells configured to store data from bit lines responsive to voltage signals on the word lines, and wherein pairs of the rows of the memory cells have word lines coupled together in shared word lines.

11. The device of claim 10, and further comprising a row driver circuit configured to output a signal on a shared word line responsive to a row select signal for either row of a pair of rows of memory cells, the row driver circuit at one end of a pair of rows of memory cells and the row driver circuit coupled to the shared word line.

12. The device of claim 11, and further comprising a level shift circuit configured to output a row driver select signal to a row driver circuit for a pair of rows of memory cells responsive to a select signal for a first row of memory cells or to a select signal for a second row of memory cells in a pair of rows of memory cells, the level shift circuit adjacent a corresponding row driver circuit.

13. The device of claim 12, wherein the row driver circuit and the level shift circuit share a pitch distance in a direction along the columns that is 1.9 to 2.1 times the pitch distance of the memory cells in the direction along the columns.

14. The device of claim 9, wherein for a row of memory cells of the rows of memory cells, every other memory cell along the row is coupled to a word line for the row and the remaining memory cells along the row are not coupled to the word line for the row.

15. The device of claim 9, wherein for a row of memory cells, every other memory cell controls a micromirror, while for the row of memory cells, intervening alternating memory cells do not control a micromirror.

16. The device of claim 9, wherein the micromirrors have a diagonal pitch in the direction of the rows that is 1.8 to 2.2 times the pitch of the memory cells in the direction of the rows.

17. The device of claim 9, wherein the micromirrors are configured to tilt in a first direction and to tilt in a second direction opposite the first direction, responsive to a voltage of the corresponding memory cells.

18. The device of claim 9, a number of memory cells along a row of memory cells being M, wherein M is a positive integer, and a number of micromirrors along a row of memory cells being less than or equal to M/2.

19. A method, comprising:
receiving, by a row driver circuit, a row select signal for either a first row of memory cells or for a second row of memory cells, the second row adjacent to the first row;
outputting, by the row driver circuit, a word signal on a shared word line in response to receiving the row select signal, the shared word line coupled to the first row of memory cells and to the second row of memory cells;
storing data in the memory cells in the first row of memory cells and in the second row of memory cells responsive to the word signal on the shared word line; and
using the data stored in the memory cells, controlling micromirrors of a digital micromirror device (DMD), the micromirrors coupled to corresponding memory cells in the first row of memory cells or in the second row of memory cells, wherein a subset of the memory cells are coupled to corresponding micromirrors.

20. The method of claim 19, wherein storing data in memory cells further comprises:
storing data in every other memory cell in the first row of memory cells responsive to the word signal on the shared word line; and
storing data in every other memory cell in the second row of memory cells responsive to the word signal on the shared word line, the memory cells in the second row that store data being staggered with respect to the memory cells in the first row that store data.

* * * * *